United States Patent
Zhang et al.

(10) Patent No.: US 12,324,300 B2
(45) Date of Patent: Jun. 3, 2025

(54) DISPLAY PANEL AND MANUFACTURING METHOD THEREFOR, AND DISPLAY APPARATUS

(71) Applicants: Beijing BOE Technology Development Co., Ltd., Beijing (CN); BOE Technology Group Co., Ltd., Beijing (CN)

(72) Inventors: Aidi Zhang, Beijing (CN); Yichi Zhang, Beijing (CN); Jinglu Bai, Beijing (CN)

(73) Assignees: Beijing BOE Technology Development Co., Ltd., Beijing (CN); BOE, Technology Group Co., Ltd., Beijing (CN)

( * ) Notice: Subject to any disclaimer, the term of this patent is extended or adjusted under 35 U.S.C. 154(b) by 776 days.

(21) Appl. No.: 17/635,993

(22) PCT Filed: Feb. 2, 2021

(86) PCT No.: PCT/CN2021/074939
§ 371 (c)(1),
(2) Date: Feb. 16, 2022

(87) PCT Pub. No.: WO2021/196876
PCT Pub. Date: Oct. 7, 2021

(65) Prior Publication Data
US 2022/0278291 A1  Sep. 1, 2022

(30) Foreign Application Priority Data

Mar. 31, 2020  (CN) .......................... 202010242234.2

(51) Int. Cl.
*H10K 50/115*  (2023.01)
*H10K 50/15*  (2023.01)
(Continued)

(52) U.S. Cl.
CPC .......... *H10K 50/115* (2023.02); *H10K 50/15* (2023.02); *H10K 50/16* (2023.02); *H10K 59/35* (2023.02);
(Continued)

(58) Field of Classification Search
CPC ..................... H10K 50/16–165; H10K 50/115
See application file for complete search history.

(56) References Cited

U.S. PATENT DOCUMENTS

2017/0229606 A1  8/2017  Kim et al.

FOREIGN PATENT DOCUMENTS

| CN | 103579519 A | 2/2014 |
|---|---|---|
| CN | 108470840 A | 8/2018 |

(Continued)

OTHER PUBLICATIONS

Chinese Office Action, mailed May 28, 2021, from Chinese Application No. 202010242234.2.
(Continued)

*Primary Examiner* — Amar Movva
(74) *Attorney, Agent, or Firm* — Workman Nydegger

(57) ABSTRACT

Provided are a display panel and a manufacturing method therefor, and a display apparatus. The display panel includes a plurality of sub-pixels of at least two colors and further comprises: a base substrate; a first electrode on the base substrate; an electron transport layer at the side of the first electrode facing away from the base substrate; a quantum dot light-emitting layer at the side of the electron transport layer facing away from the base substrate; and a second electrode at the side of the quantum dot light-emitting layer facing away from the base substrate. Materials of the quantum dot light-emitting layer of the sub-pixels of different colors are different. The electron transport layer is of an alloy heterostructure at least composed of a metal oxide and (Continued)

a metal chalcogenide. Contents of the metal chalcogenide in the alloy heterostructure at positions of the sub-pixels of different colors are different.

17 Claims, 13 Drawing Sheets

(51) Int. Cl.
*H10K 50/16* (2023.01)
*H10K 59/35* (2023.01)
*H10K 71/00* (2023.01)
*H10K 102/10* (2023.01)

(52) U.S. Cl.
CPC ....... *H10K 71/00* (2023.02); *H10K 2102/101* (2023.02)

(56) References Cited

FOREIGN PATENT DOCUMENTS

| | | | |
|---|---|---|---|
| CN | 108539034 | A | 9/2018 |
| CN | 110518131 | A | 11/2019 |
| CN | 110998891 | A | 4/2020 |
| CN | 111430560 | A | 7/2020 |

OTHER PUBLICATIONS

International Search Report, mailed May 6, 2021, from PCT Application No. PCT/CN2021/074939.

DISPLAY PANEL AND MANUFACTURING METHOD THEREFOR, AND DISPLAY APPARATUS

CROSS REFERENCE TO RELATED APPLICATIONS

The present disclosure is a national phase entry under 35 U.S.C. § 371 of International Application No. PCT/CN2021/074939, filed on Feb. 2, 2021, which claims priority of Chinese Patent Application No. 202010242234.2, filed with the China National Intellectual Property Administration (CNIPA) on Mar. 31, 2020, the entire content of which is incorporated herein by reference.

FIELD

The present disclosure relates to the technical field of display, in particular to a display panel and a method for preparing the display panel, and a display apparatus.

BACKGROUND

Quantum dots (QDs), as novel luminescent materials, have the advantages of being narrow in luminescent spectrum, adjustable in luminescent wavelength, high in spectral purity and the like. The quantum dot light emitting diodes (QLEDs) device with a quantum dot material as a luminescent layer becomes a main research direction of a novel display device at present.

In a quantum dot light emitting diode device, an electron transport layer is mainly used for electron injection and electron transfer. As an electron transport rate is often larger than a hole transport rate, carrier injection imbalance is finally caused, and electrons are excessively accumulated in a light-emitting layer. In addition, due to the fact that the forbidden bandwidths of quantum dots of different colors are different, the difficulty of injecting electrons into quantum dot light-emitting layers of different colors is different. The electron transport layer is difficult to match with the quantum dot light-emitting layers of different colors in energy levels at the same time, the light-emitting efficiency of the quantum dot light emitting diode device is low, and the light-emitting performance of the quantum dot light emitting diode device is poor.

SUMMARY

A display panel provided by the embodiments of the present disclosure includes a plurality of sub-pixels of at least two colors, and further includes:
  a base substrate;
  a first electrode on the base substrate;
  an electron transport layer on a side of the first electrode facing away from the base substrate;
  a quantum dot light-emitting layer on a side of the electron transport layer facing away from the base substrate, wherein materials of the quantum dot light-emitting layer of the sub-pixels of different colors are different; and
  a second electrode on a side of the quantum dot light-emitting layer facing away from the base substrate.

The electron transport layer is of an alloy heterostructure at least composed of a metal oxide and a metal chalcogenide.

Contents of the metal chalcogenide in the alloy heterostructure at positions of the sub-pixels of different colors are different.

Optionally, in embodiments of the present disclosure, in a direction from the base substrate to the second electrode, contents of the metal chalcogenide in the alloy heterostructure at a position of a sub-pixel are in increased gradient distribution.

Optionally, in embodiments of the present disclosure, depths of the metal chalcogenide in the alloy heterostructure at the positions of the sub-pixels of different colors are different.

Optionally, in embodiments of the present disclosure, the sub-pixels include a red sub-pixel, a green sub-pixel, and a blue sub-pixel.

The percentage of the metal chalcogenide in the alloy heterostructure at the position of the red sub-pixel is 4.5%-12.3%. The percentage of the metal chalcogenide in the alloy heterostructure at the position of the green sub-pixel is 17.9%-28.7%. The percentage of the metal chalcogenide in the alloy heterostructure at the positions of the blue sub-pixel is 31.5%-45.8%.

Optionally, in embodiments of the present disclosure, the metal chalcogenide includes a metal sulfide, a metal selenide or a metal telluride.

Optionally, in embodiments of the present disclosure, the metal oxide and the metal chalcogenide have at least one same metal element.

Optionally, in embodiments of the present disclosure, the metal oxide is zinc oxide, magnesium zinc oxide, aluminum zinc oxide or magnesium aluminum zinc oxide.

The metal chalcogenide is zinc sulfide, magnesium zinc sulfide, aluminum zinc sulfide or magnesium aluminum zinc sulfide.

Optionally, in embodiments of the present disclosure, the display panel further includes a hole injection layer between the quantum dot light-emitting layer and the second electrode, and a hole transport layer between the hole injection layer and the quantum dot light-emitting layer.

Accordingly, embodiments of the present disclosure further provide a method for preparing the above display panel, including:
  forming a first electrode on a base substrate;
  forming an electron transport layer on the first electrode; wherein the electron transport layer is of an alloy heterostructure at least composed of a metal oxide and a metal chalcogenide; and contents of the metal chalcogenide in the alloy heterostructure at positions of the sub-pixels of different colors are different;
  forming a quantum dot light-emitting layer on the electron transport layer; wherein materials of the quantum dot light-emitting layer of the sub-pixels of different colors are different; and
  forming a second electrode layer on the quantum dot light-emitting layer.

Optionally, in embodiments of the present disclosure, the forming the electron transport layer on the first electrode includes:
  forming a film layer of a metal oxide on the first electrode;
  forming a film layer of a reactive compound on the film layer of the metal oxide; and
  providing a mask plate including a plurality of light-transmitting areas;
  shielding the film layer of the reactive compound by the mask plate; and
  heating the light-transmitting areas by laser, so that the film layer of the metal oxide at the light-transmitting areas reacts with the reactive compound to obtain the metal chalcogenide.

Optionally, in embodiments of the present disclosure, positions of sub-pixels of at least two colors are provided with the metal chalcogenide.

For the sub-pixels of the at least two colors, the following operations are executed:
  forming a film layer of a reactive compound on the film layer of the metal oxide; and
  providing a mask plate including a plurality of light-transmitting areas, wherein the light-transmitting areas each corresponds to a respective one sub-pixel of the each color;
  shielding the film layer of the reactive compound by the mask plate; and
  heating the light-transmitting areas by laser, so that the metal chalcogenide is formed at positions of the sub-pixels of the each color.

Optionally, in embodiments of the present disclosure, for the sub-pixels of different colors, the number of times of executing the operations are different.

Optionally, in embodiments of the present disclosure, for the sub-pixels of different colors, the duration of the heating the light-transmitting areas by laser is different.

Optionally, in embodiments of the present disclosure, the forming the film layer of the metal oxide on the first electrode includes;
  preparing a precursor solution corresponding to the metal oxide;
  forming a thin film on a film layer where the first electrode is located by adopting the precursor solution; and
  forming the film layer of the metal oxide by heating the display panel to evaporate a solvent of the precursor solution.

Optionally, in embodiments of the present disclosure, the forming the film layer of the reactive compound on the film layer of the metal oxide includes:
  coating the film layer of the metal oxide with a sulfur-containing compound.

Optionally, in embodiments of the present disclosure, after forming the quantum dot light-emitting layer on the electron transport layer and before forming the second electrode layer on the quantum dot light-emitting layer, the method further includes:
  forming a hole transport layer on the quantum dot light-emitting layer; and
  forming a hole injection layer on the hole transport layer.

Accordingly, embodiments of the present disclosure further provide a display apparatus, including: the above display panel.

DETAILED DESCRIPTION OF THE EMBODIMENTS

Figure 1:
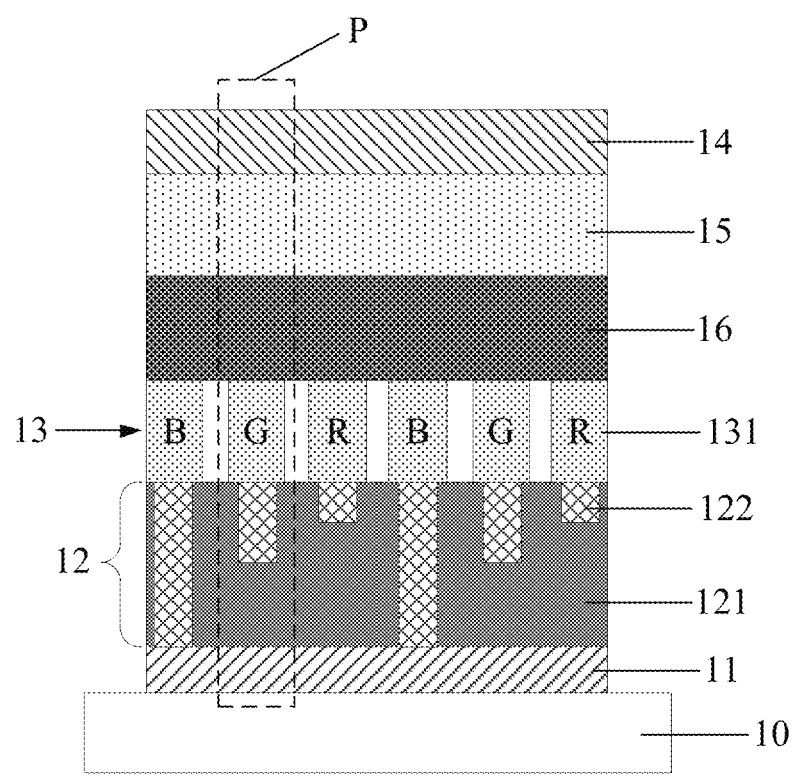
FIG. 1 is a structural schematic diagram of a display panel provided by embodiments of the present disclosure.

Embodiments of the present disclosure provide a display panel, a method for preparing the display panel, and a display apparatus aiming at the problem that the light-emitting performance of a quantum dot light emitting diode device is poor.

The embodiments of the display panel, the method for preparing the display panel, and the display apparatus provided by the embodiments of the present disclosure are described in detail below in combination with the accompanying drawings. The thickness and the shape of each film layer in the drawings do not reflect a real proportion, and the purpose is only to illustrate the content of the present disclosure.

Embodiments of the present disclosure provide a display panel, as shown in FIG. 1, including a plurality of sub-pixels P of at least two colors, and further including:
  a base substrate 10;
  a first electrode 11 on the base substrate 10;
  an electron transport layer 12 on a side of the first electrode 11 facing away from the base substrate 10;
  a quantum dot light-emitting layer 13 on a side of the electron transport layer 12 facing away from the base substrate 10, wherein the materials of the quantum dot light-emitting layer 13 of the sub-pixels P of different colors are different; and
  a second electrode 14 on a side of the quantum dot light-emitting layer 13 facing away from the base substrate 10.

The electron transport layer 12 is of an alloy heterostructure at least composed of a metal oxide 121 and a metal chalcogenide 122.

Contents of the metal chalcogenide in the alloy heterostructure at positions of the sub-pixels P of different colors are different.

In the display panel provided by the embodiments of the present disclosure, the electron transport layer is of the alloy heterostructure at least composed of the metal oxide and the metal chalcogenide. The electron transport rate in the metal chalcogenide is different from that in the metal oxide, so that the electron transport rate can be effectively regulated and controlled by adjusting the content of the metal chalcogenide in the alloy heterostructure. The transport rates of electrons and holes are further regulated and controlled. Carrier balance is achieved, and the luminous efficiency of the display panel and the device stability are improved. Further, the forbidden bandwidth of the metal chalcogenide and the forbidden bandwidth of the metal oxide are different, so that the forbidden bandwidth of the electron transport layer can be effectively regulated and controlled by adjusting the content of the metal chalcogenide in the alloy heterostructure. The energy levels in the forbidden band of the electron transport layer at the positions of the sub-pixels of different colors are different, and energy level matching between the electron transport layer and the quantum dot light-emitting layers of different colors is further realized.

For example, the first electrode 11 can be made of a transparent conductive material, such as an indium tin oxide (ITO) material, an indium zinc oxide (IZO) material, or an FTO material. The FTO material is fluorine-doped $SnO_2$ conductive glass ($SnO_2$:F). The first electrode 11 can also be made of other materials which are not limited herein. The second electrode 14 can be made of a metal material such as aluminum or silver, and the second electrode 14 is prepared by adopting an evaporation process. Alternatively, the second electrode 14 can be made of a transparent conductive material, such as an indium tin oxide material, and the second electrode 14 is prepared by adopting a magnetron sputtering process.

In implementations, in the display panel provided by embodiments of the present disclosure, the metal oxide and the metal chalcogenide have the advantages of wide band gap, high electron movement rate, high conductivity and the like, so that the electron transport layer has relatively good electron transport performance.

In embodiments of the present disclosure, the metal chalcogenide 122 in the electron transport layer 12 is located at the positions of the sub-pixels P, so that the luminous efficiency of the sub-pixels P can be regulated and controlled by adjusting the content of the metal chalcogenide 122. The alloy heterostructure includes a metal oxide and a metal chalcogenide. The electron transport rate in the metal chalcogenide is different from that in the metal oxide, by taking the metal oxide being zinc oxide and the metal chalcogenide being zinc sulfide as an example, the electron transport rate in the zinc oxide is about 200-300 $cm^2V^{-1}s^{-1}$, and the electron transport rate in the zinc sulfide is about 100-150 $cm^2V^{-1}s^{-1}$. If the content of the metal sulfide in the alloy heterostructure is different, the electron transport rate of the alloy heterostructure is also different, and thus the carrier transmission rate can be regulated and controlled by adjusting the content of the metal chalcogenide in the alloy heterostructure.

Moreover, the forbidden bandwidth of the metal chalcogenide and the forbidden bandwidth of the metal oxide are different, by taking the metal oxide being zinc oxide and the metal chalcogenide being zinc sulfide as an example, the forbidden bandwidth of the zinc oxide is about 3.37 eV and the forbidden bandwidth of the zinc sulfide is about 3.70 eV. If the contents of the metal chalcogenide in the alloy heterostructure are different, the forbidden bandwidth of the alloy heterostructure is also different. Therefore, the forbidden bandwidth of the electron transport layer can be regulated and controlled by setting the contents of the metal chalcogenide in the alloy heterostructure at the positions of the sub-pixels P of different colors to be different, so that the energy levels in the forbidden band of the electron transport layer at the positions of the sub-pixels P of different colors are different, and energy level matching between the electron transport layer and quantum dot light-emitting layers of different colors is further realized.

In embodiments of the present disclosure, the display panel includes the sub-pixels P of at least two colors, and the light emitting colors of the quantum dot light emitting layer 13 in the sub-pixels P of different colors are different, so that colorized display can be realized. Due to the fact that the forbidden bandwidths of the quantum dot light-emitting layer 13 with different light-emitting colors are different, in order to adjust the forbidden bandwidth of the electron transport layer, a metal chalcogenide is arranged at the positions of the sub-pixels P of at least one color. Besides, in order to enable the uniformity of the display panel to be good, for the sub-pixels P of the same color, the contents of the metal chalcogenide in the alloy heterostructure at the positions of the sub-pixels P are roughly the same.

In the display panel provided by embodiments of the present disclosure, in a direction where the base substrate is directed to the second electrode, the contents of the metal chalcogenide in the alloy heterostructure at the position of the sub-pixel are in increased gradient distribution.

In the actual process, in order to form the metal chalcogenide at the positions of the sub-pixels, a film layer of a metal oxide is formed on the first electrode by adopting a metal oxide material, and then the metal oxide at the positions of the sub-pixels is converted into a metal chalcogenide through an anion exchange reaction. The anion exchange reaction on the surface of the electron transport layer is relatively sufficient, and thus the closer to the interior of the electron transport layer, the lower the reaction degree, so that the contents of the metal chalcogenide in the alloy heterostructure at the position(s) of the sub-pixel(s) are in increased gradient distribution in a direction where the base substrate is directed to the second electrode.

In implementations, in the display panel provided by embodiments of the present disclosure, as shown in FIG. 1, the depths of the metal chalcogenide in the alloy heterostructures at the positions of the sub-pixels P of different colors are different.

In the actual technological process, the alloy heterostructure is manufactured through an anion exchange reaction. The larger the depth of the metal chalcogenide is, the higher the content of the metal chalcogenide in the alloy heterostructure is, and therefore by regulating and controlling the thickness of the metal chalcogenide at the positions of the sub-pixels P of different colors to be different, the contents of the metal chalcogenide in the alloy heterostructures at the positions of the sub-pixels P of different colors are different, so that the energy level matching of the electron transport layer with the quantum dot light-emitting layers of different colors is realized.

It should be noted that in the accompanying drawings in the embodiments of the present disclosure, the depth of the metal chalcogenide at the positions of blue sub-pixels is larger than the depth of the metal chalcogenide at the positions of green sub-pixels and larger than the depth of the metal chalcogenide at the positions of red sub-pixels, which is only to indicate that the depths of the metal chalcogenide at the positions of the sub-pixels of different colors are different, and does not represent the real depth relation of the metal chalcogenide of each color, and in practical application, the depth relation of the metal chalcogenide at the positions of the sub-pixels of different colors needs to be determined according to specific materials of the quantum dot light-emitting layer at the positions of the sub-pixels of different colors.

In practical application, in the display panel provided by the embodiments of the present disclosure, the sub-pixels P are divided into red sub-pixels, green sub-pixels and blue sub-pixels.

The percentage of the metal chalcogenide in the alloy heterostructure at the positions of the red sub-pixels is 4.5%-12.3%, the percentage of the metal chalcogenide in the alloy heterostructure at the positions of the green sub-pixels is 17.9%-28.7%, and the percentage of the metal chalcogenide in the alloy heterostructure at the positions of the blue sub-pixels is 31.5%-45.8%. In this way, the energy level matching effect of the electron transport layer and the quantum dot light-emitting layer is good, and the luminous efficiency of the display panel is high.

For example, in the above display panel provided by the embodiments of the present disclosure, the metal chalcogenide can include a metal sulfide, a metal selenide or a metal telluride.

For example, in the above display panel provided by the embodiments of the present disclosure, the metal oxide and the metal chalcogenide have at least one same metal element, so that in the actual technological process, a metal oxide material can be firstly adopted to form a film layer of the metal oxide, and then, the metal oxide at the positions of the sub-pixels is converted into a metal chalcogenide through an anion exchange reaction, so that an alloy heterostructure is formed, the manufacturing process is relatively simple, and the manufacturing cost is relatively low.

For example, in the above display panel provided by the embodiments of the present disclosure, the metal oxide can be zinc oxide, magnesium zinc oxide, aluminum zinc oxide or magnesium aluminum zinc oxide.

The metal chalcogenide can be zinc sulfide, magnesium zinc sulfide, aluminum zinc sulfide or magnesium aluminum zinc sulfide.

A metal oxide containing zinc element has the advantages of wide band gap, high electron movement rate, high conductivity and the like, so that the electron transport layer has good electron transport performance. The metal chalcogenide also contains the zinc element, and in the actual technological process, a metal chalcogenide is convenient to manufacture and low in manufacturing cost.

In practical application, in the above display panel provided by the embodiments of the present disclosure, as shown in FIG. 1, the display panel further includes a hole injection layer 15 located between the quantum dot light-emitting layer 13 and the second electrode 14 and a hole transport layer 16 located between the hole injection layer 15 and the quantum dot light-emitting layer 13. By arranging the hole injection layer 15 and the hole transport layer 16, holes can be effectively injected and transported, and it is guaranteed that carriers can be transmitted into the quantum dot light-emitting layer 13.

Based on the same inventive concept, embodiments of the present disclosure further provide a method for preparing the above display panel, and the principle of the method for solving the problem is similar to that of the above display panel, so that the implementation of the method may refer to the implementation of the above display panel, and repetitions are omitted.

Figure 2:
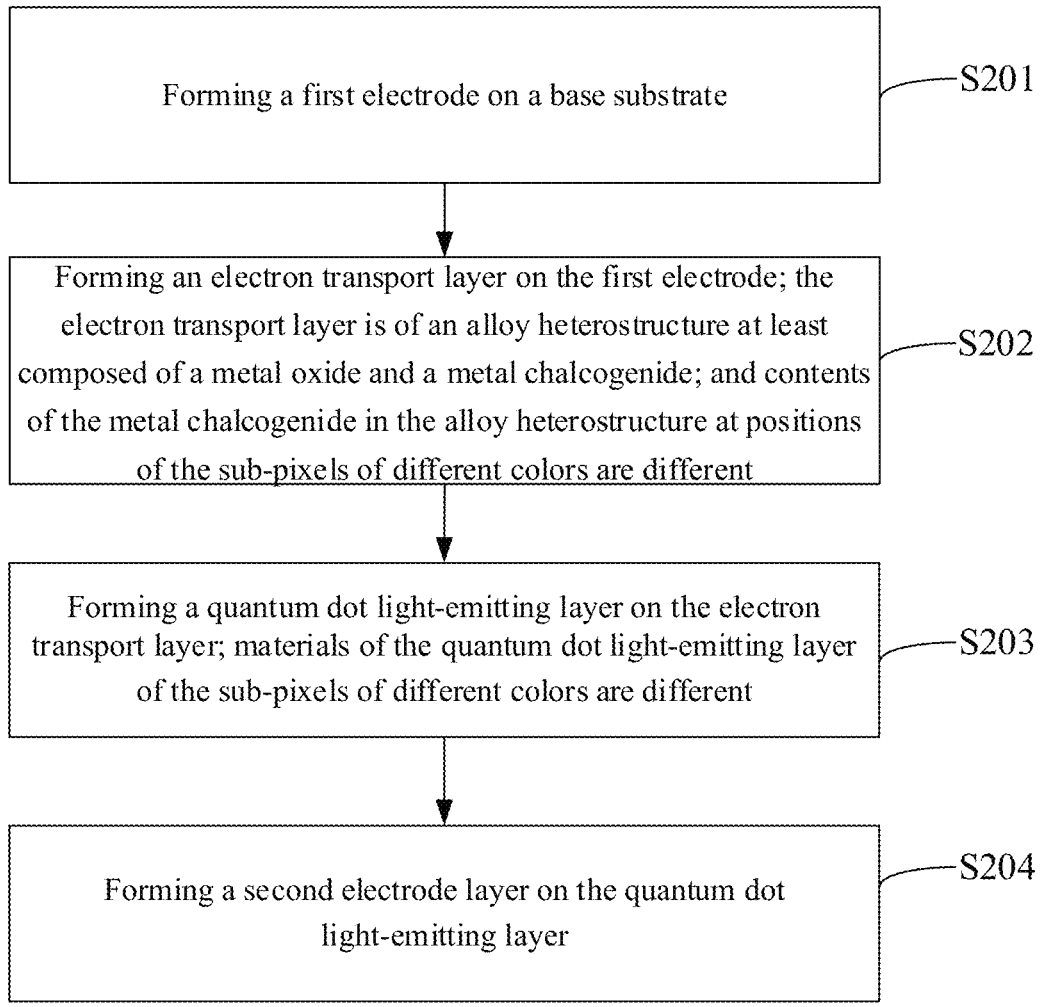
FIG. 2 is a first flow diagram of a method for preparing the display panel provided by embodiments of the present disclosure.

The method for preparing the display panel provided by the embodiments of the present disclosure, as shown in FIG. 2, includes the following operations.

S201, forming a first electrode on a base substrate.

S202, forming an electron transport layer on the first electrode. The electron transport layer is of an alloy heterostructure at least made of a metal oxide and a metal chalcogenide. Contents of the metal chalcogenide in the alloy heterostructure at the positions of the sub-pixels of different colors are different.

S203, forming a quantum dot light-emitting layer on the electron transport layer. Materials of the quantum dot light-emitting layer of the sub-pixels of different colors are different.

S204, forming a second electrode layer on the quantum dot light-emitting layer.

In the method for preparing the display panel provided by the embodiments of the present disclosure, the electron transport layer is formed on the first electrode. The electron transport layer is of the alloy heterostructure at least made of the metal oxide and the metal chalcogenide. In the manufacturing process, the content of the metal chalcogenide in the alloy heterostructure is controlled, so that the carrier transmission rate can be effectively regulated and controlled, and the forbidden bandwidth of the electron transport layer can be regulated and controlled, so that energy level matching between the electron transport layer and quantum dot light-emitting layers with different colors is realized.

Figure 4:
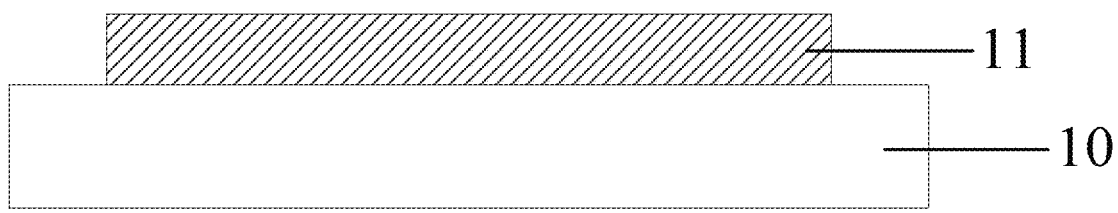
FIG. 4 is a structural schematic diagram of forming a first electrode on a base substrate.

In the operation S201, as shown in FIG. 4, a transparent conductive material can be adopted to form the first electrode 11 on the base substrate 10. For example, an ITO or FTO material can be adopted. The base substrate 10 on which the first electrode 11 is formed can be cleaned after the operation S201 and before the operation S202. For example, deionized water, ethyl alcohol and other solutions can be adopted for ultrasonic cleaning the base substrate 10, and treatment is conducted for 5-10 minutes by using an ozone cleaning machine so as to remove residual organic matters on the surface of the base substrate 10.

Figure 3:
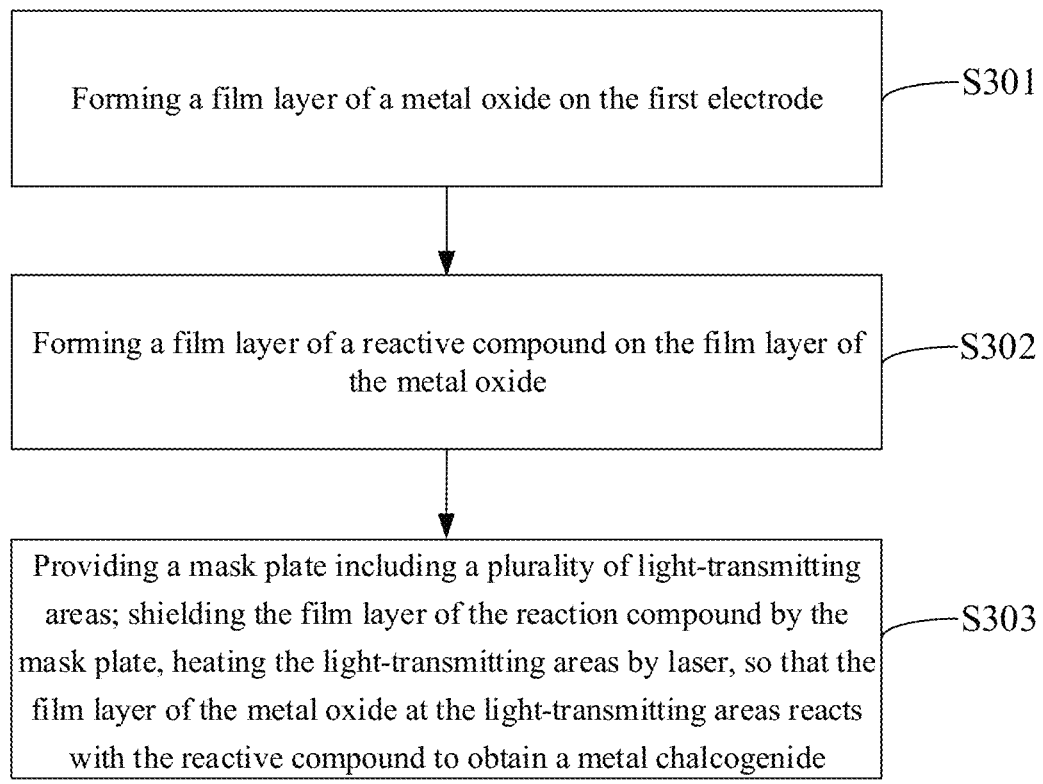
FIG. 3 is a second flow diagram of a method for preparing the display panel provided by embodiments of the present disclosure.
Figure 5:
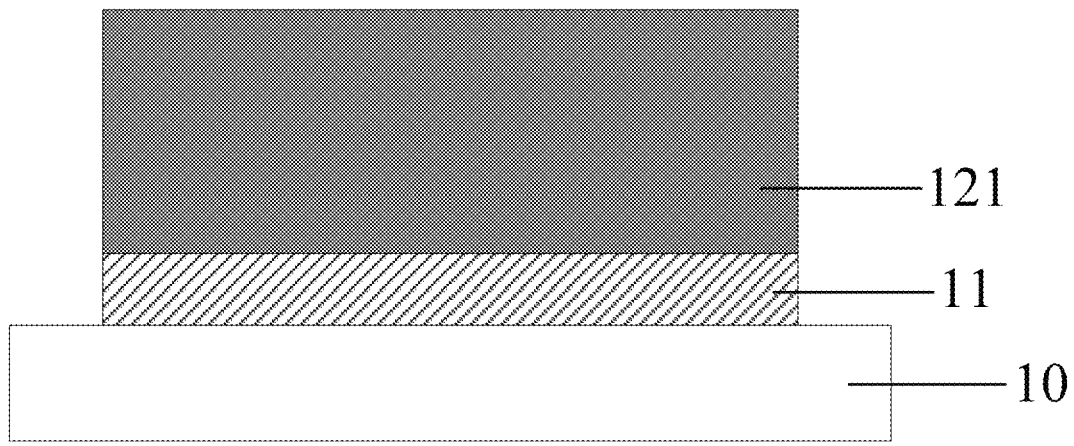
FIG. 5 is a structural schematic diagram of forming a film layer of a metal oxide on the first electrode.
Figure 6:
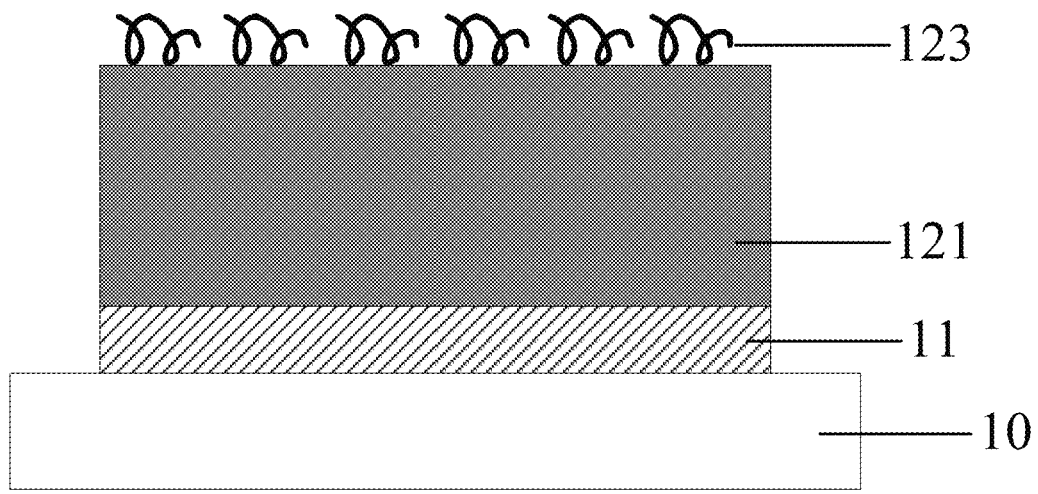
FIGS. 6-12 are structural schematic diagrams of forming a metal chalcogenide at positions of sub-pixels of a first color.
Figure 7:
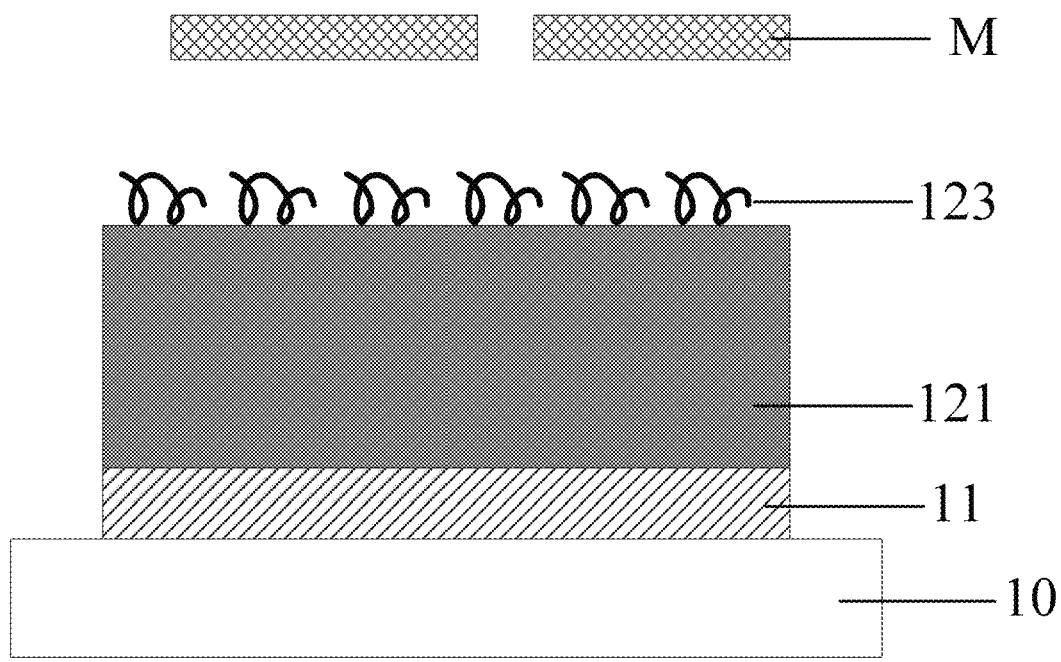
Figure 8:
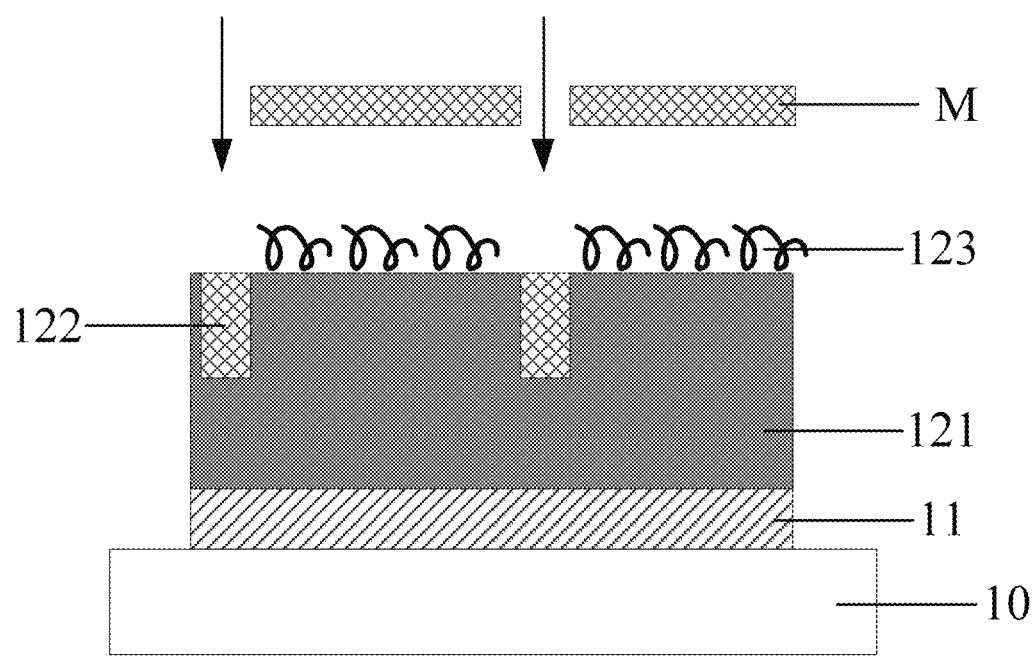

In practical application, in the method provided by the embodiments of the present disclosure, as shown in FIG. 3, the operation S202 can include:

S301, forming a film layer 121 of a metal oxide on the first electrode 11 with reference to FIG. 5;

S302, forming a film layer 123 of a reactive compound on the film layer 121 of the metal oxide with reference to FIG. 6; and S303, with reference to FIG. 7, providing a mask plate M, wherein the mask plate M includes a plurality of light-transmitting areas. With reference to FIG. 8, shielding the film layer 123 of the reactive compound by the mask plate M, and heating each light-transmitting area by adopting laser (as shown in the arrows in FIG. 8), so that the film layer 121 of the metal oxide at each light-transmitting area reacts with the reactive compound to obtain a metal chalcogenide 122.

In the operation S301, the film layer 121 of the metal oxide can be formed on the first electrode 11 by adopting a metal oxide material, for example, the film layer 121 of the metal oxide can be made of materials such as zinc oxide, magnesium zinc oxide, aluminum zinc oxide or magnesium aluminum zinc oxide.

In implementations, in the method provided by the embodiments of the present disclosure, the step S302 can include:

coating the film layer 121 of the metal oxide with a sulfur-containing compound.

In other words, the reactive compound is a sulfur-containing compound, for example, the sulfur-containing compound can be thiosemicarbazide or thioacetamide and other materials, so that in the subsequent operations, the sulfur-containing compound can react with the metal oxide in the film layer of the metal oxide to obtain a metal chalcogenide, and then the alloy heterostructure is obtained. For example, a base substrate on which a film layer of a metal oxide is formed can be immersed in an ethanol solution containing 1 mol/L of thiosemicarbazide (or thioacetamide), then the base substrate is taken out, and the thiosemicarbazide solution at the bottom of the base substrate is wiped off.

In the operation S303, the light-transmitting areas in the mask plate M can correspond to the positions where alloy heterostructures are about to be formed. The film layer 123 of the reactive compound is shielded through the mask plate M, laser can only be emitted to the film layer 123 of the reactive compound at the light-transmitting areas. Under the heating action of the laser, heat accumulation areas or microscopic heating areas are formed at the positions of the light-transmitting areas, so that the film layer of the metal oxide and the reactive compound at the positions of the light-transmitting areas are subjected to an anion exchange reaction, and part of the metal oxide in the film layer of the metal oxide is converted into a metal chalcogenide. Thus, the metal chalcogenides are respectively formed at the positions of the light-transmitting areas.

By taking the reactive compound being thiosemicarbazide, and the material of the film layer of the metal oxide being zinc oxide as an example, the chemical reaction formula of the anion exchange reaction is as follows:

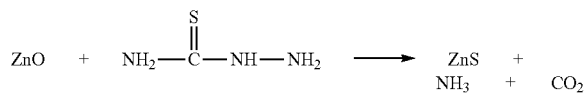

ZnO is zinc oxide,

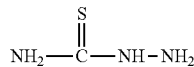

is thiosemicarbazide, ZnS is zinc sulfide, $NH_3$ is ammonia gas, and $CO_2$ is carbon dioxide.

In practical application, in order to enable the depths of the metal chalcogenide 122 in the sub-pixels P of the same color to be consistent, the plurality of light-transmitting areas in the mask plate M can correspond to the sub-pixels P of the same color. The operation S302 and the operation S303 are executed once, and the metal chalcogenide 122 in the sub-pixels of the same color can be manufactured.

In implementations, in the method provided by the embodiments of the present disclosure, the content of the metal chalcogenide in the alloy heterostructure can be regulated and controlled by controlling the number of times of anion exchange reactions.

For example, the following operations are repeated at least twice to obtain an alloy hetero structure:

S302, forming a film layer of a reactive compound on the film layer of the metal oxide; and S303', providing a mask plate, wherein the mask plate includes a plurality of light-transmitting areas; and shielding the film layer of the reactive compound by using the same mask plate, and heating each light-transmitting area by adopting laser, so that the film layer of the metal oxide at each light-transmitting area reacts with the reactive compound to obtain the metal chalcogenide.

The film layer of the metal oxide and the reactive compound are subjected to an anion exchange reaction once each time the operation S302 and the operation S303' are executed once, and the depth of the metal chalcogenide can be gradually increased by repeating the operation S302 and the operation S303' for at least two times and adopting the same mask plate each time the operation S303' is executed. The larger the depth of the metal chalcogenide is, the higher the content of the metal chalcogenide in the alloy heterostructure is. Therefore the content of the metal chalcogenide in the alloy heterostructure can be regulated and controlled by controlling the number of times of the anion exchange reactions. Moreover, the operation S302 is repeated to provide enough reactive compounds for the anion exchange reaction, so that the reaction is more sufficient. The process of repeatedly executing the operation S302 and the operation S303' to obtain the metal chalcogenide is described in detail below in combination with the accompanying drawings.

(1) as shown in FIG. 4, a first electrode 11 is formed on a base substrate 10.

(2) as shown in FIG. 5, a film layer 121 of a metal oxide is formed on the first electrode 11.

(3) as shown in FIG. 6, a film layer 123 of a reactive compound is formed on the film layer 121 of the metal oxide.

(4) as shown in the FIG. 7, a mask plate M is provided, by taking a plurality of light-transmitting areas in the mask plate M being respectively corresponding to the blue sub-pixels as an example, the mask plate M is adopted to shield areas except the blue sub-pixels; as shown in FIG. 8, laser is adopted to heat each light-transmitting area, so that the film layer 121 of the metal oxide at each light-transmitting area reacts with the reactive compound to obtain a metal chalcogenide 122.

Figure 9:
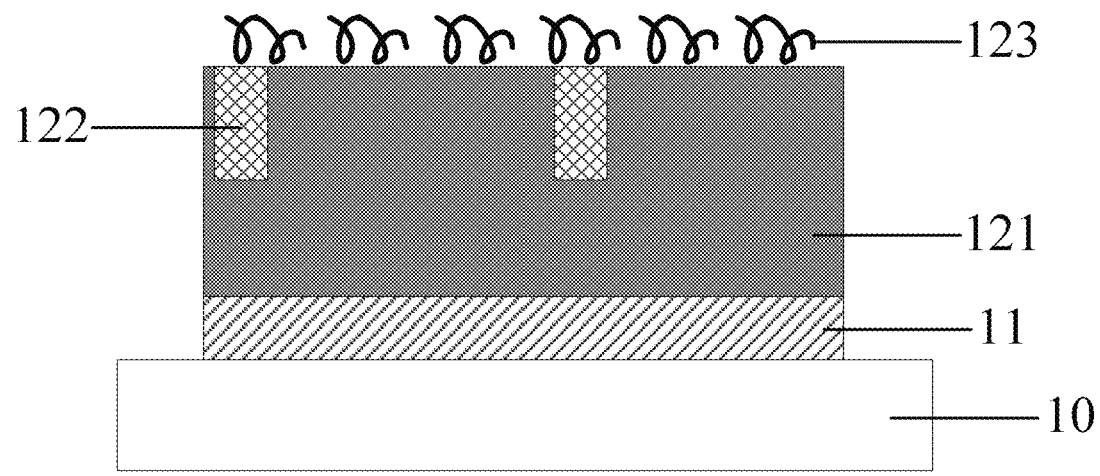

(5) as shown in the FIG. 9, a film layer 123 of a reactive compound is formed again on the film layer 121 of the metal oxide.

Figure 10:
Figure 10:
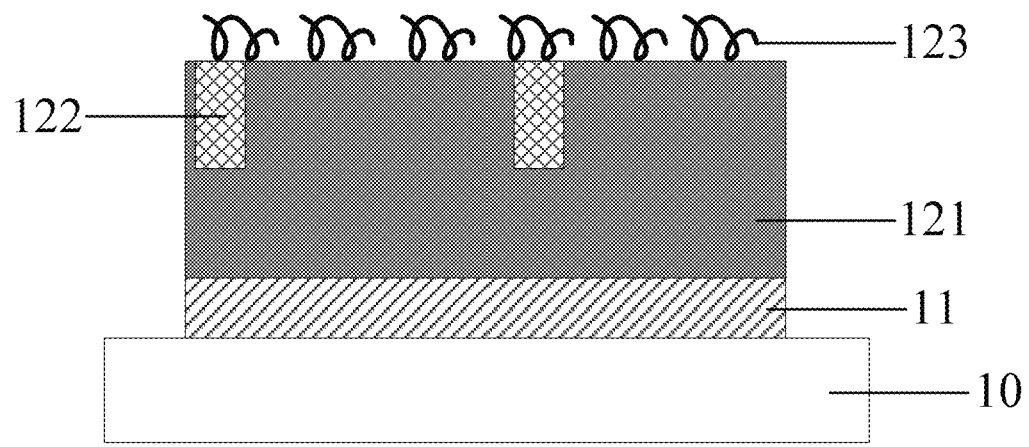
Figure 11:
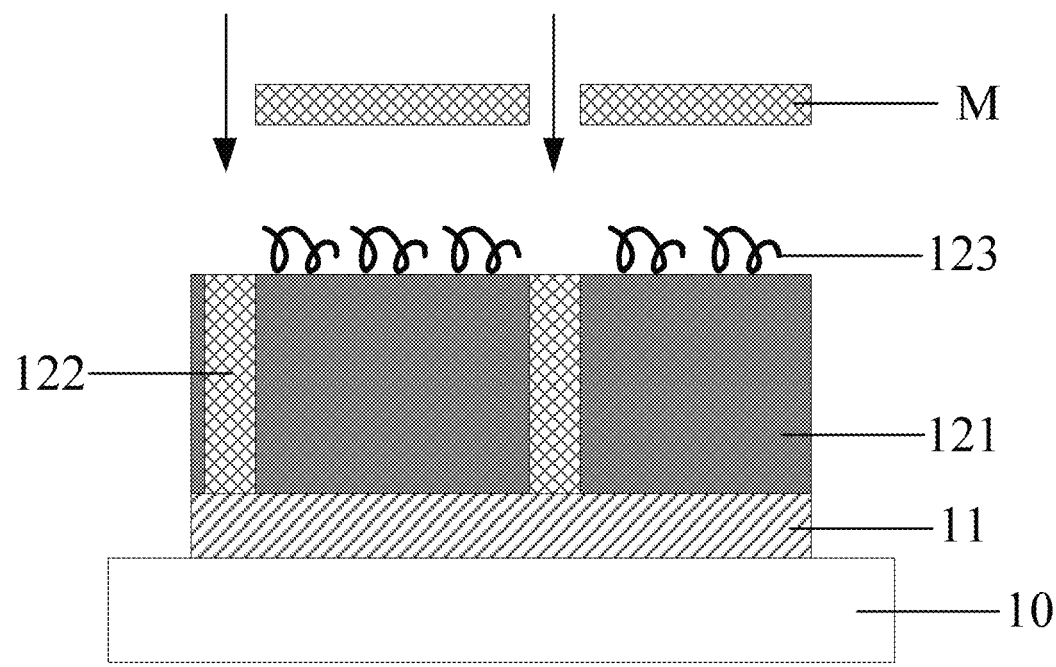
Figure 12:
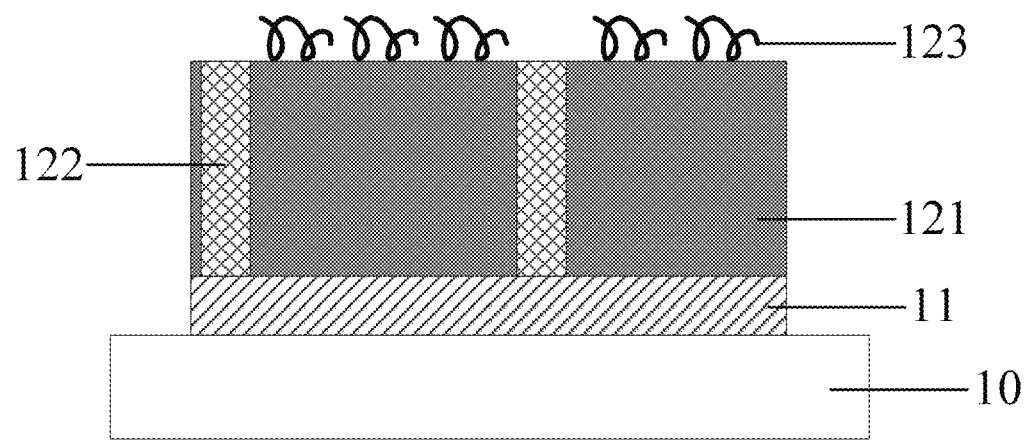

(6) as shown in FIG. 10, a same mask plate M as that in FIG. 7 is provided, and the light-transmitting areas of the mask plate M are respectively aligned with the metal chalcogenide 122 formed in FIG. 8; and as shown in FIG. 11, each light-transmitting area is heated again by adopting laser, so that the film layer 121 of the metal oxide at each light-transmitting area reacts with the reactive compound to obtain the metal chalcogenide 122 as shown in FIG. 12.

By comparing FIG. 12 and FIG. 8, it can be seen that the structure in the FIG. 12 is obtained through the operation S302 and the operation S303' twice, such that the depth of the metal chalcogenide 122 in the FIG. 12 is larger than the depth of the metal chalcogenide 122 in the FIG. 8. The depth of the metal chalcogenide can be regulated and controlled by controlling the number of times of the anion exchange reactions. In the actual technological process, the duration of heating each light-transmitting area by the laser in the operation S303' can influence the degree of the anion exchange reaction. The repetition times of the operation S302 and the operation S303' and the duration of laser heating each time the operation S303' is executed can be determined according to the required depth of the metal chalcogenide.

In practical application, in the method provided by the embodiments of the present disclosure, in order to realize colorized display, the positions of the sub-pixels of at least two colors are provided with the metal chalcogenide.

The following operations are executed for the sub-pixels of each color:

S302, forming a film layer of a reactive compound on the film layer of the metal oxide; and S303", providing a mask plate, wherein the mask plate includes a plurality of light-transmitting areas; and the light-transmitting areas each corresponds to a respective one sub-pixel of the color; and shielding the film layer of the reactive compound by adopting the mask plate, and heating each light-transmitting area by adopting laser, so that the metal chalcogenide is formed at the positions of the sub-pixels of the color.

In the embodiments of the present disclosure, in order to adjust the forbidden bandwidth of the electron transport layer and enable the energy level matching effect of the electron transport layer and the quantum dot light-emitting layer to be better, the metal chalcogenide is arranged at the positions of the sub-pixels of at least two colors. The contents of the metal chalcogenide in the alloy heterostructures at the positions of the sub-pixels of different colors are different, namely the depths of the metal chalcogenide at the positions of the sub-pixels of different colors are different, so that the metal chalcogenide can be manufactured by adopting the operation S302 and the operation S303" for the sub-pixels of each color.

In the method provided by the embodiments of the present disclosure, for the sub-pixels of different colors, the duration of heating each light-transmitting area by laser is different, so that the degree of the anion exchange reaction can be regulated and controlled by adjusting the duration of laser heating, and the depths of the metal chalcogenide at the positions of the sub-pixels of different colors are different.

Besides, the depth of the metal chalcogenide is also related to the number of times of anion exchange reactions, and in the actual technological process, the number of times of executing the operations is different for the sub-pixels of different colors, that is, the number of times of repeating the operation S302 and the operation S303" for the sub-pixels of different colors is different, and therefore, the number of times of anion exchange reactions can be adjusted, and the depth of the metal chalcogenide can be adjusted.

The operations for manufacturing the metal chalcogenide at the positions of the sub-pixels of each color are described in detail below in combination with the drawings. In the operations (3)-(6), a mask plate corresponding to the blue sub-pixels is adopted, a metal chalcogenide located at the positions of the blue sub-pixels is obtained, and the display panel as shown in FIG. 12 obtained in the operation (6) is continued to be subjected to the following operations.

Figure 13:
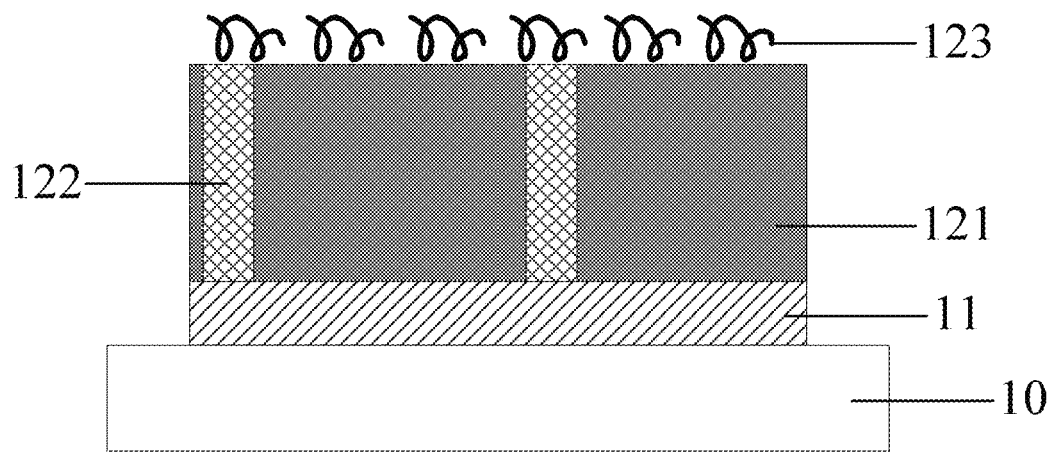
FIGS. 13-16 are structural schematic diagrams of forming a metal chalcogenide at positions of sub-pixels of a second color.

(7) as shown in FIG. 13, a film layer 123 of a reactive compound is formed on the film layer 121 of the metal oxide.

Figure 14:
Figure 14:
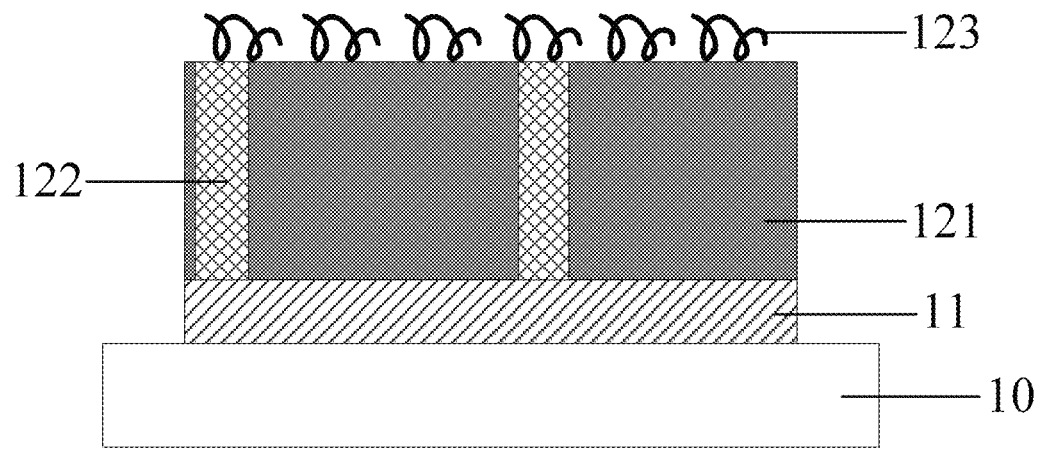
Figure 15:
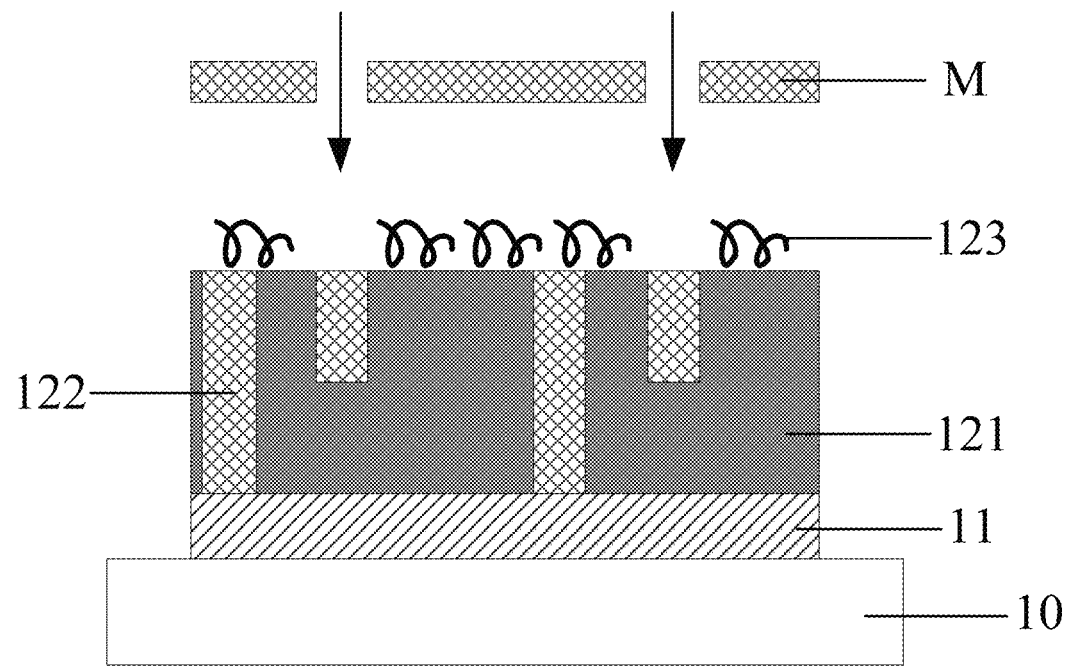
Figure 16:
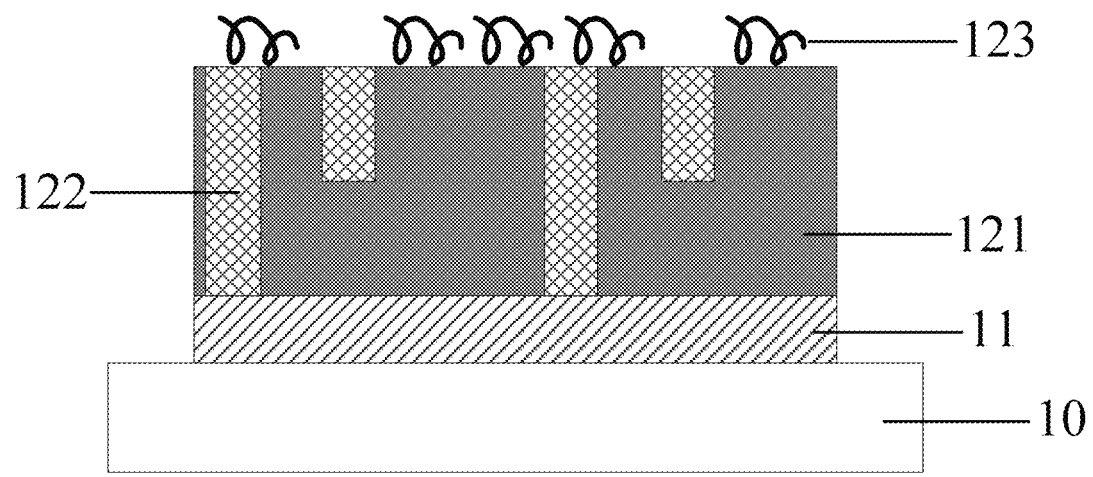

(8) as shown in the FIG. 14, a mask plate M is provided, a plurality of light-transmitting areas in the mask plate M correspond to the green sub-pixels respectively, and the mask plate M is adopted to shield areas except the green sub-pixels; as shown in FIG. 15, laser is adopted to heat each light-transmitting area, so that the film layer 121 of the metal oxide at each light-transmitting area reacts with the reactive compound to obtain the metal chalcogenide 122 at the positions of the green sub-pixels, and the obtained structure is as shown in FIG. 16.

Figure 17:
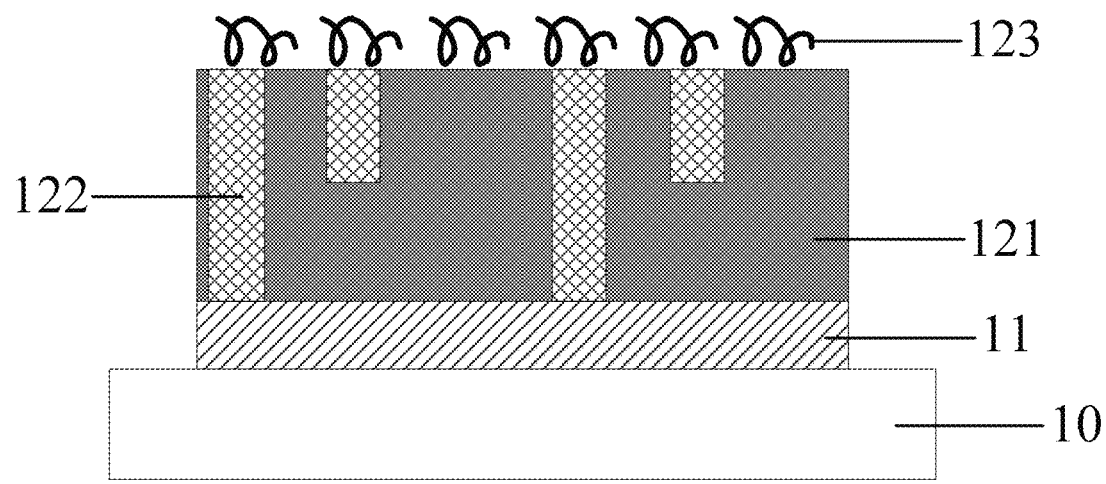
FIGS. 17-20 are structure schematic diagrams of forming a metal chalcogenide at positions of sub-pixels of a third color.

(9) as shown in FIG. 17, a film layer 123 of a reactive compound is formed on the film layer 121 of the metal oxide.

Figure 18:
Figure 18:
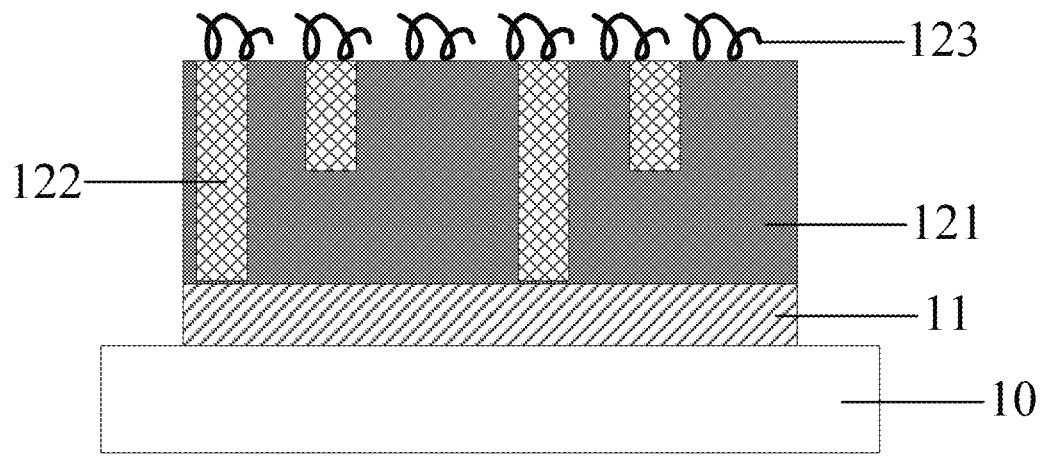
Figure 19:
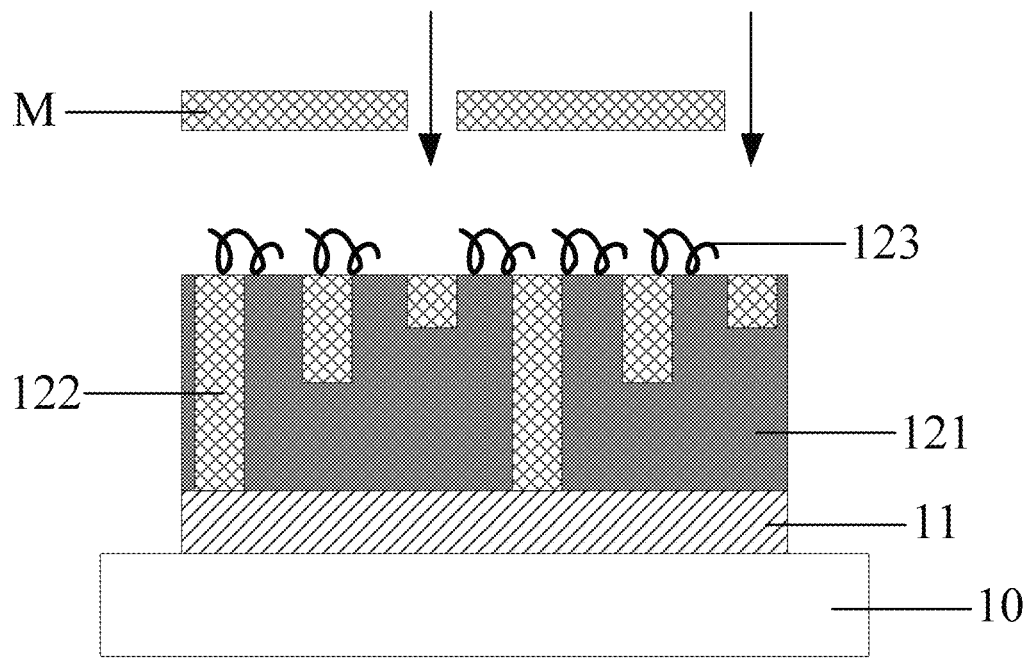
Figure 20:
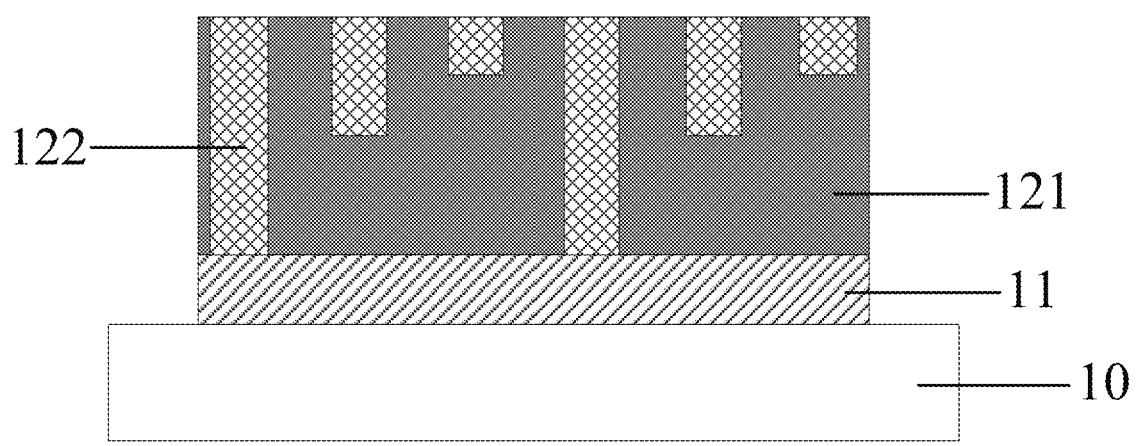

(10) as shown in the FIG. 18, a mask plate M is provided, a plurality of light-transmitting areas in the mask plate M correspond to the red sub-pixels respectively, and the mask plate M is adopted to shield the areas except the red sub-pixels; as shown in FIG. 19, laser is adopted to heat each light-transmitting area, so that the film layer 121 of the metal oxide at each light-transmitting area reacts with the reactive compound to obtain the metal chalcogenide 122 at the positions of the red sub-pixels, and then the residual reactive compound is taken out, and the obtained structure is as shown in FIG. 20.

It should be noted that 122 in the drawings of the embodiments of the present disclosure is only used for representing the positions of the metal chalcogenide and does not limit the shape of the metal chalcogenide.

In implementations, the content of the metal chalcogenide in the alloy heterostructure can be adjusted by adjusting the number of times of anion exchange reactions and the duration of laser irradiation, the energy level in the forbidden band of the electron transport layer at the position can also be adjusted, and this conclusion is proved below in combination with the drawings.

Figure 21:
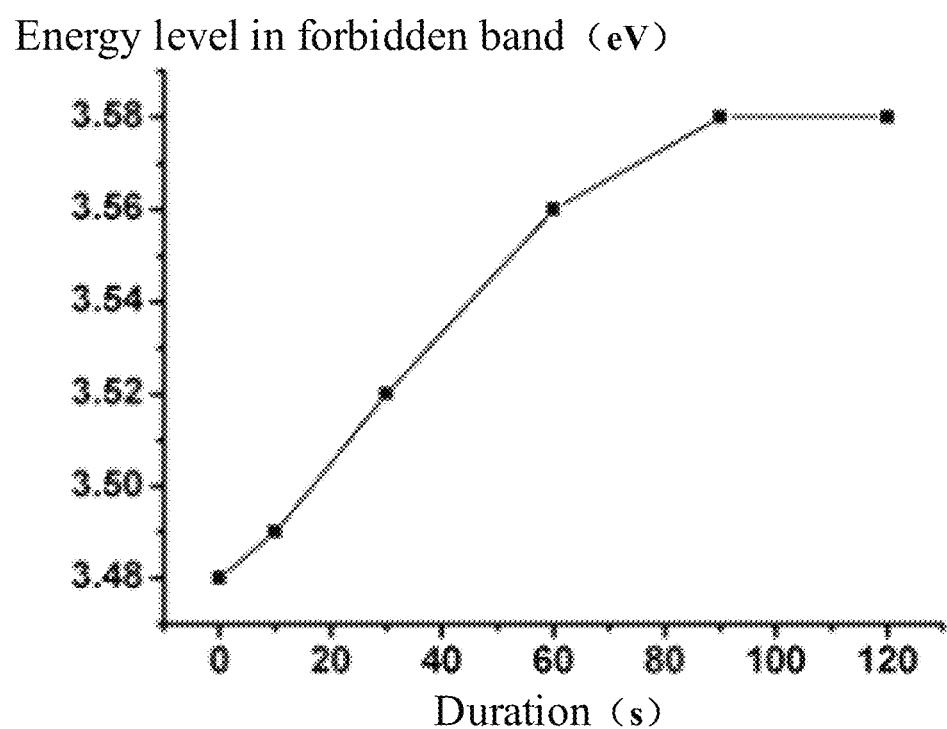
FIG. 21 is a graph showing an energy level change trend of an electron transport layer at the position of a metal chalcogenide under different laser irradiation durations after a film layer of a reactive compound is formed on a film layer of a metal oxide.

FIG. 21 is a graph showing an energy level change trend of an electron transport layer at the position of a metal chalcogenide under different laser irradiation durations after a film layer of a reactive compound is formed on a film layer of a metal oxide. The data in FIG. 21 shows a change trend graph of an energy level in a forbidden band of a local electron transport layer obtained by subjecting the soaked display panel to an anion exchange reaction in a glove box after a display panel on which the film layer of the metal oxide is formed is soaked in a 1 mol/L thiosemicarbazide solution. The anion exchange reaction is under irradiation with laser having a wavelength of 405 nm and a power of 1 mW for different durations (10 seconds, 30 seconds, 60 seconds, 90 seconds and 120 seconds).

It can be seen from FIG. 21 that the duration of laser irradiation is different, and the energy level in the forbidden band of the electron transport layer at the metal chalcogenide is different. The energy level in the forbidden band of the electron transport layer tends to increase along with the increase of the duration.

Table 1 shows the energy level change characteristics of the electron transport layer after multiple anion exchange reactions at the metal chalcogenide. The display panel is soaked in a thiosemicarbazide solution with a concentration of 1 mol/L for the same time before each anion exchange reaction, and in addition, in each anion exchange reaction, laser with a wavelength of 405 nm and a power of 1 mW is adopted for irradiation for 30 seconds.

TABLE 1

Energy level change characteristics of electron transport layer under different anion exchange times

| Number of times of anion exchange reaction | Valance band maximum (eV) | Conduction band minimum (eV) | Forbidden bandwidth (eV) |
| --- | --- | --- | --- |
| 0 times | 6.83 | 3.35 | 3.48 |
| Once | 6.87 | 3.33 | 3.54 |
| Twice | 6.91 | 3.31 | 3.60 |
| Three times | 6.93 | 3.28 | 3.65 |
| 4 times | 6.96 | 3.27 | 3.69 |

It can be obviously seen from the table 1 that the number of times of anion exchange reactions is different, the forbidden bandwidth of the electron transport layer at the metal chalcogenide is different. The forbidden bandwidth of the electron transport layer is in an increase trend along with the increase of the duration.

Figure 22:
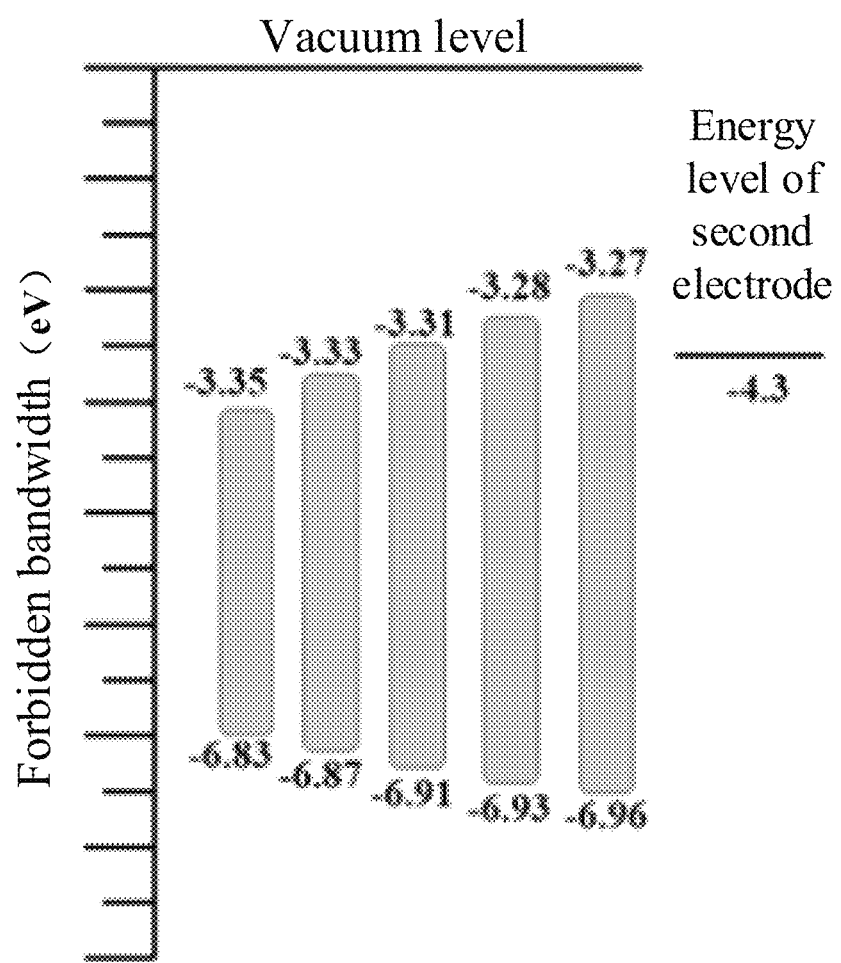
FIG. 22 shows an energy level change trend of an electron transport layer after multiple anion exchange reactions.

FIG. 22 shows an energy level change trend of an electron transport layer after multiple anion exchange reactions. Each strip-shaped pattern in the drawing represents the energy level of the electron transport layer after each anion exchange reaction. The relative position of the energy level of the second electrode is shown in the drawing. Laser of 405 nm is adopted for auxiliary heating in the anion exchange reactions. It can be seen from the drawing that the degree of the anion exchange reaction is regulated and controlled by controlling the number of times of anion exchange, and finally the content of the metal chalcogenide in the alloy heterostructure can be regulated and controlled, so that the energy level of the electron transport layer is regulated and controlled, and a conduction band minimum and a valence band maximum are adjusted; therefore, matching in energy levels in the forbidden bands of the electron transport layer and the quantum dot light-emitting layer is realized.

In the above method provided by the embodiments of the present disclosure, the above operation S301 can include the following operations.

A precursor solution corresponding to the film layer of the metal oxide is prepared. For example, 0.5-2 g of zinc acetate (or zinc nitrate and the like) is dissolved in 10 mL of a mixed solution of ethanolamine and n-butyl alcohol, and a reaction is carried out to obtain a precursor solution of zinc. A ratio of ethanolamine to n-butyl alcohol in the mixed solution can be 1:1-1:9.

A thin film is formed on a film layer where the first electrode is located by adopting the precursor solution. For example, a display panel with the first electrode formed is placed in a spin coater, 90-120 μL of the precursor solution of zinc is dropwise added to a first electrode film layer, the rotating speed of the spin coater is set to be 500-2500 rpm so as to adjust the thickness of the film layer, and the thin film is formed on the first electrode film layer after the spin coater rotates.

The display panel is heated to evaporate a solvent of the precursor solution so as to form a film layer of a metal oxide. For example, the display panel is placed on a heating stage at 250-300° C., and heated to evaporate the solvent to form a zinc oxide film layer.

In addition, besides the zinc oxide material, the metal oxide can also be magnesium zinc oxide, aluminum zinc oxide, magnesium aluminum zinc oxide and other materials, which are not limited herein.

In embodiments of the present disclosure, in the operation S203, the quantum dot light-emitting layer can be formed on the electron transport layer by adopting a solution method, for example, the quantum dot light-emitting layer can be manufactured by adopting a photoetching process, so that low-boiling-point solutions of quantum dot materials with different colors can be respectively introduced into the sub-pixel regions of corresponding colors. Specifically, for the sub-pixels of a certain color, the electron transport layer can be spin-coated with an n-hexane or n-octane solution containing a quantum dot material, a film is formed at room temperature, a rotating speed of spin coater is set to be 500-2500 rpm so as to adjust the thickness of a quantum dot film layer, and then the film layer except the sub-pixels of the color is removed by adopting a photoetching process, so that the quantum dot light-emitting layer is formed at the positions of the sub-pixels of the color. The electron transport layer provides a stable substrate for manufacturing the quantum dot light-emitting layer by adopting the solution method.

In implementations, quantum dots in the quantum dot light-emitting layer can range from 3 nm to 15 nm, and the quantum dot light-emitting layer can be made of quantum dot materials with a shell layer containing cadmium (Cd), such as CdS/ZnS, CdSe/ZnS, CdSe/ZnSeS, CdSe/CdS and other quantum dot materials, can also be made of cadmium-free quantum dot materials such as ZnSe/ZnS, InP/ZnS, CuInS/ZnS, (Zn)CuInS/ZnS, (Mn)CuInS/ZnS, AgInS/ZnS, (Zn)AgInS/ZnS, CuInSe/ZnS, CuInSeS/ZnS, PbS/ZnS and other quantum dot materials, can also be made of organic and inorganic perovskite quantum dot materials such as ($MAPbX_3$, MA=CH3NH3, X=Cl, Br or I), and can also be made of all-inorganic perovskite quantum dot materials, such as ($CsPbX_3$, X=Cl, Br or I), $CsSb_2Br_9$, $CsBi_2Br_9$ and the like.

In practical application, in the method provided by the embodiments of the present disclosure, after the operation S203 and before the operation S204, the method also can include following operatons.

With reference to FIG. 1, a hole transport layer 16 is formed on the quantum dot light-emitting layer 13. For example, TFB (poly(9,9-dioctylfluorene-CO—N-(4-butylphenyl)diphenylamine)), PVK (polyvinylcarbazole) or substances containing triarylamine and the like can be adopted to manufacture the hole transport layer. The quantum dot light-emitting layer can be spin-coated with a material of the hole transport layer, and heating is conducted to form a film. For example, when TFB is adopted to manufacture the hole transport layer, the heating temperature can range from 130° C. to 150° C., the film is formed in an inert gas atmosphere, and the thickness of the film layer can be regulated and controlled according to the rotating speed of the spin coater.

A hole injection layer 15 is formed on the hole transport layer 16. For example, materials such as PEDOT:PSS (poly (3,4-ethylenedioxythiophene)/polystyrene sulfonate) and the like can be adopted to manufacture the hole injection layer, a spin coating process can be adopted to form the hole injection layer, and the hole injection layer is heated to form a film. For example, when the PEDOT:PSS material is adopted to manufacture the hole injection layer, the heating temperature can be range from 130° C. to 150° C., and the film can be formed in air.

Optionally, in the operation S204, a second electrode can be formed on the quantum dot light-emitting layer by adopting an evaporation process, the second electrode can be made of metal materials such as aluminum, silver and the like, or the second electrode can be manufactured by a magnetron sputtering process, and the second electrode can be made of a transparent conductive material, such as an indium tin oxide material.

After the operation S204, the method provided by the embodiments of the present disclosure further includes: covering a packaging cover plate on the second electrode, and packaging the display panel by adopting ultraviolet curing glue under the excitation of an ultraviolet lamp.

Based on the same inventive concept, embodiments of the present disclosure further provide a display apparatus. The display apparatus includes the above display panel, and the display apparatus may be applied to any product or part with a display function such as a mobile phone, a tablet computer, a television, a display, a notebook computer, a digital photo frame and a navigator. The principle of the display apparatus for solving the problem is similar to that of the above display panel, so that the implementation of the display apparatus may refer to the implementation of the above display panel, and repetitions are omitted.

In the display panel provided by the embodiments of the present disclosure, the electron transport layer is of the alloy heterostructure at least made of the metal oxide and the metal chalcogenide, and the electron transport rate in the metal chalcogenide is different from that in the metal oxide, so that the electron transport rate can be effectively regulated and controlled by adjusting the content of the metal chalcogenide in the alloy heterostructure, the transport rates of electrons and holes are further regulated and controlled, carrier balance is achieved, and the luminous efficiency of the display panel and the device stability are improved; and the forbidden bandwidth of the metal chalcogenide and the forbidden bandwidth of the metal oxide are different, so that the forbidden bandwidth of the electron transport layer can be effectively regulated and controlled by adjusting the content of the metal chalcogenide in the alloy heterostructure, the energy levels in the forbidden band of the electron transport layer at the positions of the sub-pixels of different colors are different, and energy level matching between the electron transport layer and the quantum dot light-emitting layers of different colors is further realized.

Although the preferred embodiments of the present disclosure have been described, those skilled in the art can make additional modifications and variations on these embodiments once they know the basic creative concept. Therefore, the appended claims are intended to be explained as including the preferred embodiments and all modifications and variations falling within the scope of the present disclosure.

Obviously, those skilled in the art can make various modifications and variations to the embodiments of the present disclosure without departing from the spirit and scope of the present disclosure. In this way, if these modifications and variations of the embodiments of the present disclosure fall within the scope of the claims of the present disclosure and their equivalents, the present disclosure is also intended to include these modifications and variations.

What is claimed is:

1. A display panel, wherein the display panel comprises a plurality of sub-pixels of at least two colors, and further comprises:
   a base substrate;
   a first electrode on the base substrate;
   an electron transport layer on a side of the first electrode facing away from the base substrate;
   a quantum dot light-emitting layer on a side of the electron transport layer facing away from the base substrate, wherein materials of the quantum dot light-emitting layer of the sub-pixels of different colors are different; and
   a second electrode on a side of the quantum dot light-emitting layer facing away from the base substrate;
   wherein the electron transport layer is of an alloy heterostructure at least composed of a metal oxide and a metal chalcogenide; and
   contents of the metal chalcogenide in the alloy heterostructure at positions of the sub-pixels of different colors are different.

2. The display panel according to claim 1, wherein in a direction from the base substrate to the second electrode, contents of the metal chalcogenide in the alloy heterostructure at a position of a sub-pixel are in increased gradient distribution.

3. The display panel according to claim 1, wherein depths of the metal chalcogenide in the alloy heterostructure at the positions of the sub-pixels of different colors are different.

4. The display panel according to claim 1, wherein the sub-pixels comprise a red sub-pixel, a green sub-pixel and a blue sub-pixel; and
   a percentage of the metal chalcogenide in the alloy heterostructure at a position of the red sub-pixel is 4.5%-12.3%, a percentage of the metal chalcogenide in the alloy heterostructure at a position of the green sub-pixel is 17.9%-28.7%, and a percentage of the metal chalcogenide in the alloy heterostructure at a position of the blue sub-pixel is 31.5%-45.8%.

5. The display panel according to claim 1, wherein the metal chalcogenide comprises a metal sulfide, a metal selenide or a metal telluride.

6. The display panel according to claim 1, wherein the metal oxide and the metal chalcogenide are provided with at least one same metal element.

7. The display panel according to claim 6, wherein:
   the metal oxide is zinc oxide, magnesium zinc oxide, aluminum zinc oxide or magnesium aluminum zinc oxide; and
   the metal chalcogenide is zinc sulfide, magnesium zinc sulfide, aluminum zinc sulfide or magnesium aluminum zinc sulfide.

8. The display panel according to claim 1, further comprising:
   a hole injection layer between the quantum dot light-emitting layer and the second electrode, and
   a hole transport layer between the hole injection layer and the quantum dot light-emitting layer.

9. A method for preparing the display panel according to claim 1, comprising:
   forming the first electrode on the base substrate;
   forming the electron transport layer on the first electrode; wherein the electron transport layer is of an alloy heterostructure at least composed of a metal oxide and a metal chalcogenide; and the contents of the metal chalcogenide in the alloy heterostructure at the positions of the sub-pixels of different colors are different;
   forming the quantum dot light-emitting layer on the electron transport layer; wherein the materials of the quantum dot light-emitting layer of the sub-pixels of different colors are different; and
   forming the second electrode layer on the quantum dot light-emitting layer.

10. The method according to claim 9, wherein said forming the electron transport layer on the first electrode comprises:
    forming a film layer of the metal oxide on the first electrode;
    forming a film layer of a reactive compound on the film layer of the metal oxide;
    providing a mask plate comprising a plurality of light-transmitting areas;
    shielding the film layer of the reactive compound by the mask plate; and
    heating the light-transmitting areas by laser, so that the film layer of the metal oxide at the light-transmitting areas reacts with the reactive compound to obtain the metal chalcogenide.

11. The method according to claim 10, wherein positions of sub-pixels of at least two colors are provided with the metal chalcogenide;
    for sub-pixels of each of the at least two colors, following operations are executed:
    forming a film layer of a reactive compound on the film layer of the metal oxide;
    providing a mask plate comprising a plurality of light-transmitting areas, wherein the light-transmitting areas each corresponds to a respective one sub-pixel of the each color;
    shielding the film layer of the reactive compound by the mask plate; and
    heating the light-transmitting areas by laser, so that the metal chalcogenide is formed at positions of the sub-pixels of the each color.

12. The method according to claim 11, wherein for the sub-pixels of different colors, a quantity of times of executing the operations is different.

13. The method according to claim 11, wherein for the sub-pixels of different colors, a duration of said heating the light-transmitting areas by laser is different.

14. The method according to claim 10, wherein said forming the film layer of the metal oxide on the first electrode comprises:

preparing a precursor solution corresponding to the metal oxide;

forming a thin film on a film layer where the first electrode is located by adopting the precursor solution; and forming the film layer of the metal oxide by heating the display panel to evaporate a solvent of the precursor solution.

15. The method according to the claim 10, wherein said forming the film layer of the reactive compound on the film layer of the metal oxide comprises:

coating the film layer of the metal oxide with a sulfur-containing compound.

16. The method according to claim 9, wherein after forming the quantum dot light-emitting layer on the electron transport layer and before forming the second electrode layer on the quantum dot light-emitting layer, the method further comprises:

forming a hole transport layer on the quantum dot light-emitting layer; and forming a hole injection layer on the hole transport layer.

17. A display apparatus, wherein the display apparatus comprises the display panel according to claim 1.

\* \* \* \* \*

UNITED STATES PATENT AND TRADEMARK OFFICE
CERTIFICATE OF CORRECTION

| | | |
|---|---|---|
| PATENT NO. | : 12,324,300 B2 | Page 1 of 1 |
| APPLICATION NO. | : 17/635993 | |
| DATED | : June 3, 2025 | |
| INVENTOR(S) | : Aidi Zhang, Yichi Zhang and Jinglu Bai | |

It is certified that error appears in the above-identified patent and that said Letters Patent is hereby corrected as shown below:

On the Title Page

Item (73) Assignees: delete "," after BOE in second Assignees name

Signed and Sealed this
Twelfth Day of August, 2025

Coke Morgan Stewart
*Acting Director of the United States Patent and Trademark Office*